US011804821B2

(12) United States Patent
Ou et al.

(10) Patent No.: US 11,804,821 B2
(45) Date of Patent: Oct. 31, 2023

(54) HIGH-FREQUENCY SURFACE ACOUSTIC WAVE RESONATOR AND METHOD FOR MAKING THE SAME

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Xin Ou, Shanghai (CN); Shibin Zhang, Shanghai (CN); Hongyan Zhou, Shanghai (CN); Chengli Wang, Shanghai (CN); Pengcheng Zheng, Shanghai (CN); Kai Huang, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

(*) Notice: Subject to any disclaimer, the term of this patent is extended or adjusted under 35 U.S.C. 154(b) by 381 days.

(21) Appl. No.: 16/860,089

(22) Filed: Apr. 28, 2020

(65) Prior Publication Data
US 2020/0412332 A1    Dec. 31, 2020

(51) Int. Cl.
*H03H 9/02* (2006.01)
*H03H 9/25* (2006.01)
*H03H 9/13* (2006.01)

(52) U.S. Cl.
CPC .......... *H03H 9/25* (2013.01); *H03H 9/02228* (2013.01); *H03H 9/02551* (2013.01); *H03H 9/02559* (2013.01); *H03H 9/13* (2013.01)

(58) Field of Classification Search
CPC .. H03H 9/25; H03H 9/02228; H03H 9/02551; H03H 9/02559

(Continued)

(56) References Cited

U.S. PATENT DOCUMENTS

2005/0194864 A1* 9/2005 Miura ................ H03H 9/02574
310/313 R
2010/0038993 A1* 2/2010 Umeda ............... H03H 9/02574
310/313 B (Continued)

FOREIGN PATENT DOCUMENTS

CN    106911317 A    6/2017
CN    108493325 A    9/2018

(Continued)

OTHER PUBLICATIONS

Wang, Qihong, «The latest edition of the Electrician's Manual», Oct. 31, 2006, Henan Science and Technology Press, p. 1188-1189, CN.

(Continued)

*Primary Examiner* — Derek J Rosenau

(57) ABSTRACT

The present disclosure provides a high frequency surface acoustic wave resonator and a method for making the same. The high frequency surface acoustic wave resonator includes: a high wave velocity supporting substrate, a piezoelectric film disposed on a top surface of the high wave velocity supporting substrate, and a top electrode disposed on a top surface of the piezoelectric film; a velocity of a body wave propagating in the high wave velocity supporting substrate is greater than a velocity of a target elastic wave propagating in the piezoelectric film. The conductivity of the high wave velocity supporting substrate is greater than 1E3 $\Omega \cdot cm$. The high frequency surface acoustic wave resonator and the method for making the same of the present disclosure solve the problem that the operating frequency of the traditional surface acoustic wave resonator is low.

6 Claims, 4 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

2011/0273061 A1* 11/2011 Thalmayr .......... H03H 9/02102
310/346
2014/0020822 A1 1/2014 Shimizu

FOREIGN PATENT DOCUMENTS

| CN | 109891612 X | 6/2019 |
|---|---|---|
| JP | 2016046574 A | 4/2016 |

OTHER PUBLICATIONS

Qu, Yuanfang, «Modern ceramic materials and technology», May 31, 2008, East China University of Science and Technology Press, p. 58-59, CN.

* cited by examiner

HIGH-FREQUENCY SURFACE ACOUSTIC WAVE RESONATOR AND METHOD FOR MAKING THE SAME

CROSS REFERENCE TO RELATED APPLICATION

This application claims the benefits of priority to Chinese Patent Application No. CN 2019105765712, entitled "High-Frequency Surface Acoustic Wave Resonator and Method for Making the same", filed with CNIPA on Jun. 28, 2019, the contents of which are incorporated herein by reference in its entirety.

BACKGROUND

Field of Disclosure

The disclosure relates to the technical field of microelectronic devices, in particular, to a high frequency surface acoustic wave resonator and a method for making the same.

Description of Related Arts

Although acoustic wave resonators (acoustic wave filters) are widely used in radio frequency communication, with the continuous development of radio frequency communication technology, especially with the arrival of 5G communication, it is required that the acoustic wave resonators operate at a higher frequency.

The traditional acoustic wave resonators are mainly divided into surface acoustic wave resonators and body acoustic wave resonators. The operating frequency of surface acoustic wave resonators is generally lower than 3 GHz, which cannot fully meet the requirements of 5G communication. Therefore, it is urgent for those skilled in the art to improve the operating frequency of the surface acoustic wave resonators.

SUMMARY

The present disclosure provides a high frequency surface acoustic wave resonator and a method for making the same, for solving the problem of low operating frequency of traditional surface acoustic wave resonators.

The present disclosure provides a high frequency surface acoustic wave resonator, which includes: a high wave velocity supporting substrate, a piezoelectric film disposed on a top surface of the high wave velocity supporting substrate, and a top electrode disposed on a top surface of the piezoelectric film; a velocity of a body wave propagating in the high wave velocity supporting substrate is greater than a velocity of a target elastic wave propagating in the piezoelectric film.

Optionally, the target elastic wave excited by the piezoelectric film includes a symmetric lamb wave, an antisymmetric lamb wave, a shear constant wave or a Rayleigh wave, the velocity of the body wave propagating in the high wave velocity supporting substrate is greater than an intrinsic wave velocity of the target elastic wave excited by the piezoelectric film.

Optionally, the velocity of the body wave propagating in the high wave velocity supporting substrate is at least simultaneously greater than an intrinsic wave velocity of the antisymmetric lamb wave and the shear constant wave excited by the piezoelectric film.

Optionally, the target elastic wave excited by the piezoelectric film includes a symmetric lamb wave or an antisymmetric lamb wave, and when the velocity of the body wave propagating in the high wave velocity supporting substrate is smaller than an intrinsic wave velocity of the target elastic wave excited by the piezoelectric film, a thickness of the top electrode is increased or a material density of the top electrode is increased, to reduce a velocity of the target elastic wave propagating in the piezoelectric film, such that the velocity of the body wave propagating in the high wave velocity supporting substrate is greater than the velocity of the target elastic wave propagating in the piezoelectric film.

Optionally, the target elastic wave excited by the piezoelectric film includes a symmetric lamb wave or an antisymmetric lamb wave, and when the velocity of the body wave propagating in the high wave velocity supporting substrate is smaller than an intrinsic wave velocity of the target elastic wave excited by the piezoelectric film, the high frequency surface acoustic wave resonator further includes a cladding layer covering a top surface of the piezoelectric film and a top surface of the top electrode, to reduce a velocity of the target elastic wave propagating in the piezoelectric film, such that the velocity of the body wave propagating in the high wave velocity supporting substrate is greater than the velocity of the target elastic wave propagating in the piezoelectric film.

Optionally, a ratio of a thickness of the piezoelectric film to a wavelength of the target elastic wave excited by the piezoelectric film is less than 2.

Optionally, the top electrode includes one or a combination of an interdigital electrode, a circular strip electrode, a sector strip electrode or a polygonal plate electrode.

Optionally, when the top electrode is the interdigital electrode, digits in the interdigital electrode are parallel to each other, and an angle between a perpendicular direction of each of the digits and a propagation direction of the target elastic wave is less than 20°.

Optionally, the high frequency surface acoustic wave resonator further includes: a bottom electrode disposed between the high wave velocity supporting substrate and the piezoelectric film.

Optionally, a material of the high wave velocity supporting substrate includes: silicon carbide, diamond, diamond-like, sapphire, quartz, silicon or aluminum nitride. A material of the piezoelectric film includes: lithium niobate, potassium niobate, lithium tantalates, aluminum nitride, quartz or zinc oxide.

Optionally, a thermal conductivity of the high wave velocity supporting substrate is greater than a thermal conductivity of the piezoelectric film.

The present disclosure further provides a method for making a high frequency surface acoustic wave resonator. The method includes: providing a high wave velocity support substrate; forming a piezoelectric film on a top surface of the high wave velocity supporting substrate; forming a top electrode on a top surface of the piezoelectric film; a velocity of a body wave propagating in the high wave velocity supporting substrate is greater than a velocity of a target elastic wave propagating in the piezoelectric film.

Optionally, the target elastic wave excited by the piezoelectric film includes a symmetric lamb wave or an antisymmetric lamb wave, and the method further includes: forming a cladding layer on a top surface of the piezoelectric film and a top surface of the top electrode, when the velocity of the body wave propagating in the high wave velocity supporting substrate is smaller than an intrinsic wave velocity of the target elastic wave excited by the piezoelectric film.

Optionally, a ratio of a thickness of the piezoelectric film to a wavelength of the target elastic wave excited by the piezoelectric film is less than 2.

Optionally, the top electrode includes one or a combination of an interdigital electrode, a circular strip electrode, a sector strip electrode or a polygonal plate electrode.

Optionally, when the top electrode is the interdigital electrode, digits in the interdigital electrode are parallel to each other, and an angle between a perpendicular direction of each of the digits and a propagation direction of the target elastic wave is less than 20°.

Optionally, the method further includes: forming a bottom electrode between the high wave velocity supporting substrate and the piezoelectric film.

Optionally, a material of the high wave velocity supporting substrate includes: silicon carbide, diamond, diamond-like, sapphire, quartz, silicon or aluminum nitride. A material of the piezoelectric film includes: lithium niobate, potassium niobate, lithium tantalates, aluminum nitride, quartz or zinc oxide.

Optionally, a thermal conductivity of the high wave velocity supporting substrate is greater than a thermal conductivity of the piezoelectric film.

As described above, the high frequency surface acoustic wave resonator and the method for making the same of the present disclosure have the following beneficial effects:

In the present disclosure, the velocity of the body wave propagating in the high wave velocity supporting substrate is greater than the velocity of the target elastic wave propagating in the piezoelectric film. Therefore, when the piezoelectric film excites the symmetrical lamb wave or the antisymmetric lamb wave with a high wave velocity, a supporting substrate having a higher wave velocity is used to constrain the symmetric lamb wave or the antisymmetric lamb wave to propagate to the supporting substrate, thereby improving the resonant frequency of the surface acoustic wave resonator by increasing the velocity of the target elastic wave while maintaining a high Q value. Or when the piezoelectric film excites a shearing constant wave or a Rayleigh wave, an interfacial composite film is formed by using a supporting substrate having a higher wave velocity and a piezoelectric film, the overall propagating wave velocity of the shearing constant wave or the Rayleigh wave in the piezoelectric film is increased through the high wave velocity of the shearing constant wave or the Rayleigh wave at the interface of the supporting substrate, thereby improving the resonant frequency of the surface acoustic wave resonator by increasing the velocity of the target elastic wave while maintaining a high Q value.

In the present disclosure, the ratio of the thickness of the piezoelectric film to the wavelength of the target elastic wave excited by the piezoelectric film is less than 2, so as to perform dispersion compensation on the target elastic wave, thereby exciting the target elastic wave with a higher wave velocity.

In the present disclosure, the angle between the perpendicular direction of each of the digits in the interdigital electrode and the propagation direction of the target elastic wave is less than 20°, so as to suppress the clutter in the parallel interdigital direction in the target elastic wave, thereby further improving the electromechanical coupling coefficient and Q value of the high frequency surface acoustic wave resonator.

In the present disclosure, the thermal conductivity of the high wave velocity supporting substrate is greater than the thermal conductivity of the piezoelectric film, so as to reduce the temperature drift of the high frequency surface acoustic wave resonator, thereby improving the temperature drift stability and the power bearing capacity of the high frequency surface acoustic wave resonator.

Figure 1:
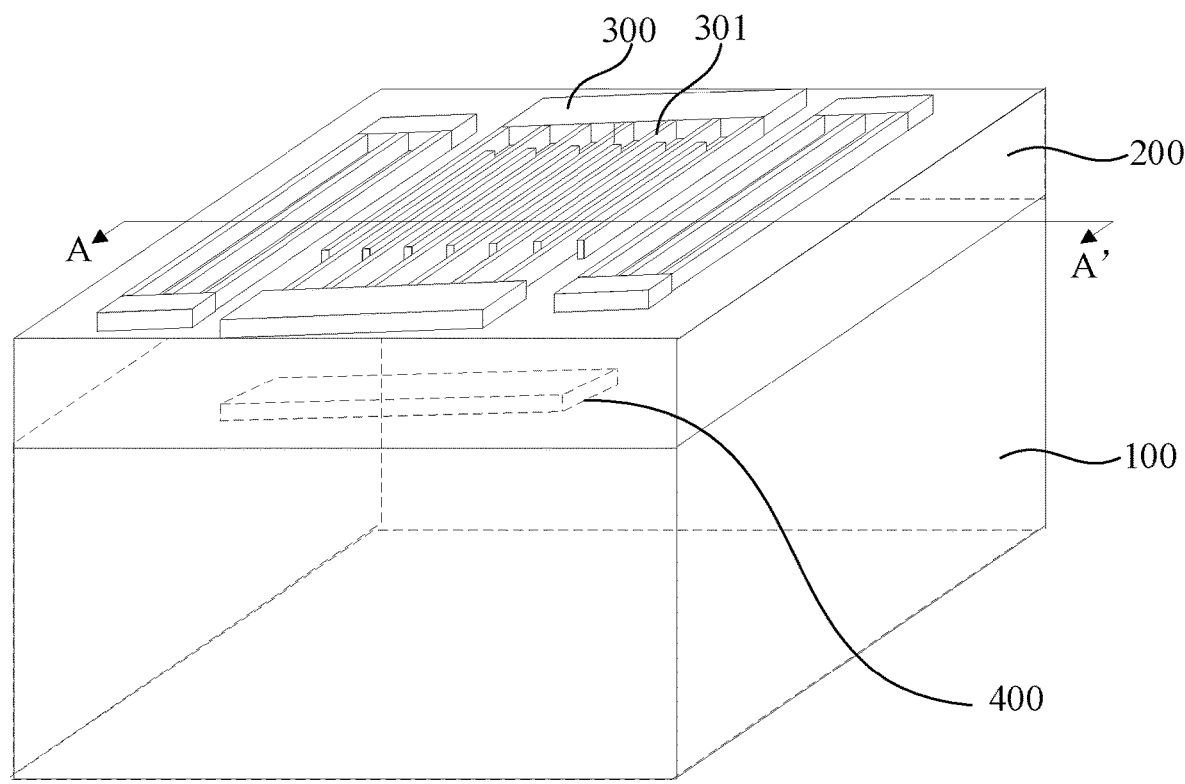
FIG. 1 shows a schematic view of a high frequency surface acoustic wave resonator according to the present disclosure.

| Description of reference numerals | |
| --- | --- |
| 100 | High wave velocity supporting substrate |
| 200 | Piezoelectric film |
| 300 | Top electrode |

DETAILED DESCRIPTION OF THE PREFERRED EMBODIMENTS

The embodiments of the present disclosure will be described below. Those skilled in the art can easily understand other advantages and effects of the present disclosure according to contents disclosed by the specification. The present disclosure can also be implemented or applied through other different specific implementation modes. Various modifications or changes can also be made to all details in the specification based on different points of view and applications without departing from the spirit of the present disclosure.

Referring to FIGS. 1-6. It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complex.

As shown in FIG. 1, the present disclosure provides a high frequency surface acoustic wave resonator, which includes: a high wave velocity supporting substrate, a piezoelectric film disposed on a top surface of the high wave velocity supporting substrate, and a top electrode disposed on a top surface of the piezoelectric film; a velocity of a body wave propagating in the high wave velocity supporting substrate is greater than a velocity of a target elastic wave propagating in the piezoelectric film.

In some embodiments, the conductivity of the high wave velocity supporting substrate is greater than 1E3 Ω·cm.

In some embodiments, the material of the high wave velocity supporting substrate 100 includes: silicon carbide, diamond, diamond-like, sapphire, quartz, silicon or aluminum nitride. The material of the piezoelectric film 200 includes: lithium niobate, potassium niobate, lithium tantalates, aluminum nitride, quartz or zinc oxide.

To satisfy that the velocity of the body wave propagating in the high wave velocity supporting substrate 100 is greater than the velocity of the target elastic wave propagating in the piezoelectric film 200, the material having a large wave velocity is preferably selected as the high wave velocity supporting substrate 100, and the material having a small wave velocity is used as the piezoelectric film 200, that is, the wave velocity in the high wave velocity supporting substrate 100 is greater than the wave velocity in the piezoelectric film 200. For example, the material of the high wave velocity supporting substrate 100 includes diamond, and the material of the piezoelectric film 200 includes lithium niobate, lithium tantalates, aluminum nitride, or zinc oxide. Or the material of the high wave velocity supporting substrate 100 includes silicon carbide, and the material of the piezoelectric film 200 includes lithium niobate or lithium tantalates. When the piezoelectric film 200 is lithium niobate, the electromechanical coupling coefficient of the target elastic wave based on the lithium niobate piezoelectric film is greater than 14%. When the piezoelectric film 200 is lithium tantalates, the electromechanical coupling coefficient of the target elastic wave based on the lithium tantalates piezoelectric film is greater than 6.5%. Or the material of the high wave velocity supporting substrate 100 includes sapphire, and the material of the piezoelectric film 200 includes lithium niobate or zinc oxide.

At this time, when the target elastic wave excited by the piezoelectric film 200 includes a shear constant wave (SH wave) or a Rayleigh wave, the velocity of the body wave propagating in the high wave velocity supporting substrate 100 is greater than the intrinsic wave velocity of the target elastic wave excited by the piezoelectric film 200. In the present embodiment, in the transmission process of the SH wave or the Rayleigh wave excited by the piezoelectric film 200, part of the energy is distributed in the piezoelectric film, and part of the energy is distributed at the interface of the high wave velocity supporting substrate 100. Therefore, the interface region of the high wave velocity supporting substrate 100 and the piezoelectric film 200 constitute a composite film. Since the wave velocity of the SH wave or the Rayleigh wave at the interface of the high wave velocity supporting substrate 100 is greater than the wave velocity of the SH wave or the Rayleigh wave in the piezoelectric film, the equivalent wave velocity in the composite film is greater than the wave velocity in the piezoelectric film, thereby increasing the wave velocity of the SH wave or the Rayleigh wave. That is, the present embodiment uses a supporting substrate having a higher wave velocity and a piezoelectric film to form the composite film, and uses the high wave velocity of the SH wave or the Rayleigh wave at the interface of the supporting substrate to increase the overall wave velocity of the SH wave or the Rayleigh wave, thereby increasing the resonance frequency of the surface acoustic wave resonator by increasing the wave velocity of the SH wave or the Rayleigh wave.

When the target elastic wave excited by the piezoelectric film 200 includes a symmetric lamb wave (S wave) or an antisymmetric lamb wave (A wave), the velocity of the body wave propagating in the high wave velocity supporting substrate 100 is greater than the intrinsic wave velocity of the target elastic wave excited by the piezoelectric film 200. In the present embodiment, although the piezoelectric film excites the S wave or the A wave which has a high wave velocity, since the wave velocity in the high wave velocity supporting substrate 100 is larger than the wave velocity in the piezoelectric film 200, when the S wave or the A wave is transmitted from the piezoelectric film 200 to the high wave velocity supporting substrate 100, the S wave or the A wave will be reflected back to the piezoelectric film 200 by the high wave velocity supporting substrate 100, that is, the S wave or the A wave is well confined in the piezoelectric film 200. That is, the present embodiment confines the S wave or the A wave which has a high wave velocity to propagate to the supporting substrate by a supporting substrate having a higher wave velocity, thereby increasing the resonance frequency of the surface acoustic wave resonator by using the S wave or the A wave which has a high wave velocity. Of course, the present embodiment also forms the composite film through the supporting substrate interface and the piezoelectric film, thereby increasing the wave velocity of the S wave or the A wave.

In some embodiments, the velocity of the body wave propagating in the high wave velocity supporting substrate is at least simultaneously greater than an intrinsic wave velocity of the antisymmetric lamb wave and the shear constant wave excited by the piezoelectric film.

Of course, in practical applications, it is also possible to use a material having a small wave velocity as the high wave velocity supporting substrate 100, and use a material having a large wave velocity as the piezoelectric film 200. That is, the wave velocity in the high wave velocity supporting substrate 100 is slightly smaller than the wave velocity in the piezoelectric film 200. For example, the material of the high wave velocity supporting substrate 100 includes sapphire, and the material of the piezoelectric film 200 includes lithium niobate or the like. At this time, when the target elastic wave excited by the piezoelectric film 200 includes a symmetric lamb wave (S wave) or an antisymmetric lamb wave (A wave), the velocity of the body wave propagating in the high wave velocity supporting substrate 100 is slightly smaller than the intrinsic wave velocity of the target elastic wave excited by the piezoelectric film 200. To achieve that the wave velocity of the body wave propagating in the high wave velocity supporting substrate 100 is greater than the wave velocity of the target elastic wave propagating in the piezoelectric film 200, piezoelectric films of different cut types may be selected, the propagation direction of the target elastic wave in the piezoelectric film may be changed, the thickness of the top electrode 300 may be increased, the material density of the top electrode may be increased, or a cladding layer (such as a silicon dioxide film) may be formed on the top surface of the piezoelectric film 200 and the top surface the top electrode 300. The propagation velocity of the S wave or the A wave in the piezoelectric film 200 is decreased due to a mass load, such that the velocity of the body wave propagating in the final high wave velocity supporting substrate 100 is greater than the velocity of the target elastic wave propagating in the piezoelectric film 200, while the resonant frequency of the surface acoustic wave resonator is increased by using the S wave or the A wave which has a high wave velocity.

It should be noted that in order to increase the resonant frequency of the surface acoustic wave resonator, only when the velocity of the body wave propagating in the high wave velocity supporting substrate 100 is slightly smaller than the intrinsic wave velocity of the target elastic wave excited by the piezoelectric film 200, the velocity of the target elastic wave in the piezoelectric film 200 can be reduced through the method of the present embodiment. If the velocity of the body wave propagating in the high wave velocity supporting substrate 100 is significantly different from the intrinsic wave velocity of the target elastic wave excited by the piezoelectric film 200, the velocity of the target elastic wave needs to be reduced very low to satisfy the velocity of the body wave propagating in the high wave velocity supporting substrate 100 is greater than the velocity of the target elastic wave propagating in the piezoelectric film 200. But at this time, the resonance frequency of the surface acoustic wave resonator cannot be increased by increasing the relative velocity of the target elastic wave.

In some embodiments, when the high wave velocity supporting substrate 100 and the piezoelectric film 200 are material-matched, it is preferable that the thermal conductivity of the high wave velocity supporting substrate 100 is greater than the thermal conductivity of the piezoelectric film 200, so as to improve the heat dissipation performance of the device and reduce the temperature drift of the high frequency surface acoustic wave resonator, that is, to improve the temperature drift stability and at the same time improve its power bearing capacity. Further, in the present embodiment, the target elastic wave having a high wave velocity is used to increase the resonance frequency of the surface acoustic wave resonator. Therefore, the material of the piezoelectric film is preferably a material having a large wave velocity and a small acoustic loss. In practical applications, the material of the high wave velocity supporting substrate is generally selected from diamond or silicon carbide. Since diamond is difficult to process in large size and is expensive, silicon carbide is generally preferred. The piezoelectric film may be a single crystal film or a polycrystalline film, but in view of wave velocity and acoustic loss, a single crystal film is generally preferred.

In some embodiments, a ratio of a thickness of the piezoelectric film 200 to a wavelength of the target elastic wave excited by the piezoelectric film 200 is less than 2. Further, the ratio of the thickness of the piezoelectric film 200 to the wavelength of the target elastic wave excited by the piezoelectric film 200 is less than 1. Preferably, the ratio of the thickness of the piezoelectric film 200 to the wavelength of the target elastic wave excited by the piezoelectric film 200 ranges from 0.05 to 0.35. In the present embodiment, the dispersion compensation on the target elastic wave excited by the piezoelectric film is performed by adjusting the ratio of the thickness of the piezoelectric film to the wavelength of the target elastic wave excited by the piezoelectric film, thereby exciting the target elastic wave with a higher wave velocity.

Figure 2:
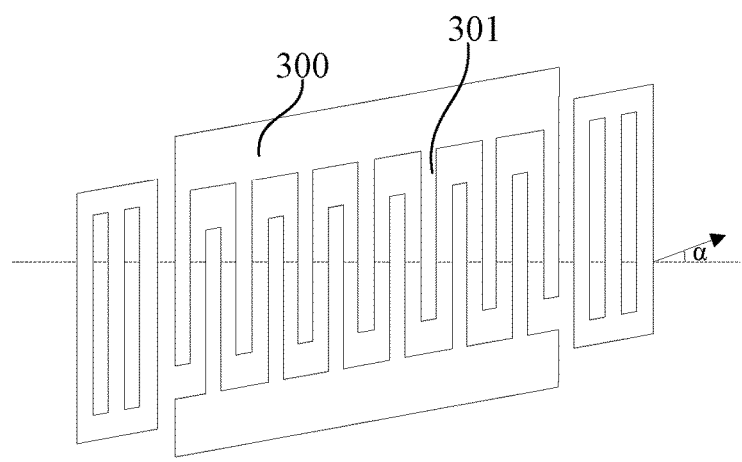
FIG. 2 shows a schematic view of an interdigital electrode in the high frequency surface acoustic wave resonator according to the present disclosure.

In some embodiments, the top electrode 300 includes one or a combination of an interdigital electrode, a circular strip electrode, a sector strip electrode or a polygonal plate electrode. As shown in FIG. 2, when the top electrode 200 is the interdigital electrode, digits in the interdigital electrode are parallel to each other, and an angle α between a perpendicular direction of each of the digits and a propagation direction of the target elastic wave is less than 20°. In the present embodiment, the angle between the perpendicular direction of the digit in the interdigital electrode and the propagation direction of the target elastic wave is designed to suppress the clutter in the target elastic wave parallel to the direction of the digit, thereby further improving the electromechanical coupling coefficient and Q value of the high frequency surface acoustic wave resonator.

In some embodiments, the high frequency surface acoustic wave resonator further includes an insulating dielectric layer disposed between the high wave velocity supporting substrate 100 and the piezoelectric film 200, for improving the electromechanical coupling coefficient of the surface acoustic wave resonator.

In some embodiments, the high frequency surface acoustic wave resonator further includes: a bottom electrode 400 disposed between the high wave velocity supporting substrate 100 and the piezoelectric film 200. In practical applications, whether the high frequency surface acoustic wave resonator includes the bottom electrode 400 may be determined according to a piezoelectric constant component required by exciting the target elastic wave and a direction thereof. When the piezoelectric constant component in the desired piezoelectric film 200 is distributed in the surface, the high frequency surface acoustic wave resonator does not include the bottom electrode 400, and an electric field is applied to the piezoelectric film 200 through the top electrode 300, so that the piezoelectric film 200 excites the target elastic wave. When the piezoelectric constant component in the desired piezoelectric film 200 is distributed outside the surface, the high frequency surface acoustic wave resonator includes the bottom electrode 400, and at this time, an electric field is applied to the piezoelectric film 200 by the combined action of the top electrode 300 and the bottom electrode 400, so that the piezoelectric film 200 excites the target elastic wave.

Referring to FIG. 1, the present embodiment further provides a method for making a high frequency surface acoustic wave resonator. The method includes: providing a high wave velocity support substrate 100; forming a piezoelectric film 200 on a top surface of the high wave velocity supporting substrate 100; forming a top electrode 300 on a top surface of the piezoelectric film 200; a velocity of a body wave propagating in the high wave velocity supporting substrate 100 is greater than a velocity of a target elastic wave propagating in the piezoelectric film 200.

In some embodiments, the conductivity of the high wave velocity supporting substrate is greater than 1E3 Ω·cm.

In some embodiments, the piezoelectric film 200 is formed on the top surface of the high wave velocity supporting substrate 100 by a deposition process, an epitaxial process, an ion beam strip process or a bonding process. Of course, other processes capable of forming the piezoelectric film 200 on the top surface of the high wave velocity supporting substrate 100 are also applicable to the present embodiment, and the present embodiment does not limit the specific process for forming the piezoelectric film 200. A material of the high wave velocity supporting substrate 100 includes: silicon carbide, diamond, diamond-like, sapphire, quartz, silicon or aluminum nitride. A material of the piezoelectric film 200 includes: lithium niobate, potassium niobate, lithium tantalates, aluminum nitride, quartz or zinc oxide.

In order to satisfy that the velocity of the body wave propagating in the high wave velocity supporting substrate 100 is greater than the velocity of the target elastic wave propagating in the piezoelectric film 200, the material having a large wave velocity is preferably selected as the high wave velocity supporting substrate 100, and the material having a small wave velocity is used as the piezoelectric film 200, that is, the wave velocity in the high wave velocity supporting substrate 100 is greater than the wave velocity in the piezoelectric film 200. For example, the material of the high wave velocity supporting substrate 100 includes diamond, and the material of the piezoelectric film 200 includes lithium niobate, lithium tantalates, aluminum nitride, or zinc oxide. Or the material of the high wave velocity supporting substrate 100 includes silicon carbide, and the material of the piezoelectric film 200 includes lithium niobate or lithium tantalates. Or the material of the high wave velocity supporting substrate 100 includes sapphire, and the material of the piezoelectric film 200 includes lithium niobate or zinc oxide. When the piezoelectric film 200 is lithium niobate, the electromechanical coupling coefficient of the target elastic wave based on the lithium niobate piezoelectric film is greater than 14%. When the piezoelectric film 200 is lithium tantalates, the electromechanical coupling coefficient of the target elastic wave based on the lithium tantalates piezoelectric film is greater than 6.5%.

At this time, when the target elastic wave excited by the piezoelectric film 200 includes a shear constant wave (SH wave) or a Rayleigh wave, the velocity of the body wave propagating in the high wave velocity supporting substrate 100 is greater than the intrinsic wave velocity of the target elastic wave excited by the piezoelectric film 200. In the present embodiment, in the transmission process of the SH wave or the Rayleigh wave excited by the piezoelectric film 200, part of the energy is distributed in the piezoelectric film, and part of the energy is distributed at the interface of the high wave velocity supporting substrate 100. Therefore, the interface region of the high wave velocity supporting substrate 100 and the piezoelectric film 200 constitute a composite film. Since the wave velocity of the SH wave or the Rayleigh wave at the interface of the high wave velocity supporting substrate 100 is greater than the wave velocity of the SH wave or the Rayleigh wave in the piezoelectric film, the equivalent wave velocity in the composite film is greater than the wave velocity in the piezoelectric film, thereby increasing the wave velocity of the SH wave or the Rayleigh wave. That is, the present embodiment uses a supporting substrate having a higher wave velocity and a piezoelectric film to form the composite film, and uses the high wave velocity of the SH wave or the Rayleigh wave at the interface of the supporting substrate to increase the overall wave velocity of the SH wave or the Rayleigh wave, thereby increasing the resonance frequency of the surface acoustic wave resonator by increasing the wave velocity of the SH wave or the Rayleigh wave.

When the target elastic wave excited by the piezoelectric film 200 includes a symmetric lamb wave (S wave) or an antisymmetric lamb wave (A wave), the velocity of the body wave propagating in the high wave velocity supporting substrate 100 is greater than the intrinsic wave velocity of the target elastic wave excited by the piezoelectric film 200. In the present embodiment, although the piezoelectric film excites the S wave or the A wave which has a high wave velocity, since the wave velocity in the high wave velocity supporting substrate 100 is larger than the wave velocity in the piezoelectric film 200, when the S wave or the A wave is transmitted from the piezoelectric film 200 to the high wave velocity supporting substrate 100, the S wave or the A wave will be reflected back to the piezoelectric film 200 by the high wave velocity supporting substrate 100, that is, the S wave or the A wave is well confined in the piezoelectric film 200. That is, the present embodiment confines the S wave or the A wave which has a high wave velocity to propagate to the supporting substrate by a supporting substrate having a higher wave velocity, thereby increasing the resonance frequency of the surface acoustic wave resonator by using the S wave or the A wave which has a high wave velocity. Of course, the present embodiment also forms the composite film through the supporting substrate interface and the piezoelectric film, thereby increasing the wave velocity of the S wave or the A wave.

In some embodiments, the velocity of the body wave propagating in the high wave velocity supporting substrate is at least simultaneously greater than an intrinsic wave velocity of the antisymmetric lamb wave and the shear constant wave excited by the piezoelectric film.

Of course, in practical applications, it is also possible to use a material having a small wave velocity as the high wave velocity supporting substrate 100, and use a material having a large wave velocity as the piezoelectric film 200. That is, the wave velocity in the high wave velocity supporting substrate 100 is slightly smaller than the wave velocity in the piezoelectric film 200. For example, the material of the high wave velocity supporting substrate 100 includes sapphire, and the material of the piezoelectric film 200 includes lithium niobate or the like. At this time, when the target elastic wave excited by the piezoelectric film 200 includes a symmetric lamb wave (S wave) or an antisymmetric lamb wave (A wave), the velocity of the body wave propagating in the high wave velocity supporting substrate 100 is slightly smaller than the intrinsic wave velocity of the target elastic wave excited by the piezoelectric film 200. To achieve that the wave velocity of the body wave propagating in the high wave velocity supporting substrate 100 is greater than the wave velocity of the target elastic wave propagating in the piezoelectric film 200, piezoelectric films of different cut types may be selected, the propagation direction of the target elastic wave in the piezoelectric film may be changed, the thickness of the top electrode 300 may be increased, the material density of the top electrode may be increased, or a cladding layer (such as a silicon dioxide film) may be formed on the top surface of the piezoelectric film 200 and the top surface the top electrode 300. The propagation velocity of the S wave or the A wave in the piezoelectric film 200 is decreased due to a mass load, such that the velocity of the body wave propagating in the final high wave velocity supporting substrate 100 is greater than the velocity of the target elastic wave propagating in the piezoelectric film 200, while the resonant frequency of the surface acoustic wave resonator is increased by using the S wave or the A wave which has a high wave velocity.

It should be noted that in order to increase the resonant frequency of the surface acoustic wave resonator, only when the velocity of the body wave propagating in the high wave velocity supporting substrate 100 is slightly smaller than the intrinsic wave velocity of the target elastic wave excited by the piezoelectric film 200, the velocity of the target elastic wave in the piezoelectric film 200 can be reduced through the method of the present embodiment. If the velocity of the body wave propagating in the high wave velocity supporting substrate 100 is significantly different from the intrinsic wave velocity of the target elastic wave excited by the piezoelectric film 200, the velocity of the target elastic wave needs to be reduced very low to satisfy the velocity of the body wave propagating in the high wave velocity supporting substrate 100 is greater than the velocity of the target elastic wave propagating in the piezoelectric film 200. But at this time, the resonance frequency of the surface acoustic wave resonator cannot be increased by increasing the relative velocity of the target elastic wave.

Specifically, when the high wave velocity supporting substrate 100 and the piezoelectric film 200 are material-matched, it is preferable that the thermal conductivity of the high wave velocity supporting substrate 100 is greater than the thermal conductivity of the piezoelectric film 200, so as to improve the heat dissipation performance of the device and reduce the temperature drift of the high frequency surface acoustic wave resonator, that is, to improve the temperature drift stability and at the same time improve its power bearing capacity. Further, in the present embodiment, the target elastic wave having a high wave velocity is used to increase the resonance frequency of the surface acoustic wave resonator. Therefore, the material of the piezoelectric film is preferably a material having a large wave velocity and a small acoustic loss. In practical applications, the material of the high wave velocity supporting substrate is generally selected from diamond or silicon carbide. Since diamond is difficult to process in large size and is expensive, silicon carbide is generally preferred. The piezoelectric film may be a single crystal film or a polycrystalline film, but in view of wave velocity and acoustic loss, a single crystal film is generally preferred.

Specifically, a ratio of a thickness of the piezoelectric film 200 to a wavelength of the target elastic wave excited by the piezoelectric film 200 is less than 2. Further, the ratio of the thickness of the piezoelectric film 200 to the wavelength of the target elastic wave excited by the piezoelectric film 200 is less than 1. Preferably, the ratio of the thickness of the piezoelectric film 200 to the wavelength of the target elastic wave excited by the piezoelectric film 200 ranges from 0.05 to 0.35. In the present embodiment, the dispersion compensation on the target elastic wave excited by the piezoelectric film is performed by adjusting the ratio of the thickness of the piezoelectric film to the wavelength of the target elastic wave excited by the piezoelectric film, thereby exciting the target elastic wave with a higher wave velocity.

In some embodiments, a method for forming the top electrode 300 includes: 3.1) forming a metal material layer on the top surface of the piezoelectric film 200, and forming a photoresist layer on the top surface of the metal material layer; 3.2) patterning the photoresist layer to form a photolithographic pattern on the top surface of the metal material layer; 3.3) etching the metal material layer by using the photolithographic pattern as an etch mask to form a top electrode on the top surface of the piezoelectric film.

Specifically, the top electrode 300 includes one or a combination of an interdigital electrode, a circular strip electrode, a sector strip electrode or a polygonal plate electrode. As shown in FIG. 2, when the top electrode 200 is the interdigital electrode, digits in the interdigital electrode are parallel to each other, and an angle α between a perpendicular direction of each of the digits and a propagation direction of the target elastic wave is less than 20°. In the present embodiment, the angle between the perpendicular direction of the digit in the interdigital electrode and the propagation direction of the target elastic wave is designed to suppress the clutter in the target elastic wave parallel to the direction of the digit, thereby further improving the electromechanical coupling coefficient and Q value of the high frequency surface acoustic wave resonator.

In some embodiments, the method further includes: forming an insulating dielectric layer between the high wave velocity supporting substrate 100 and the piezoelectric film 200, for improving the electromechanical coupling coefficient of the surface acoustic wave resonator.

In some embodiments, the method further includes: forming a bottom electrode 400 between the high wave velocity supporting substrate 100 and the piezoelectric film 200. In practical applications, whether the high frequency surface acoustic wave resonator includes the bottom electrode 400 may be determined according to a piezoelectric constant component required by exciting the target elastic wave and a direction thereof. When the piezoelectric constant component in the desired piezoelectric film 200 is distributed in the surface, the bottom electrode 400 does not need to be formed in the high frequency surface acoustic wave resonator, and at this time, an electric field is applied to the piezoelectric film 200 through the top electrode 300, so that the piezoelectric film 200 excites the target elastic wave. When the piezoelectric constant component in the desired piezoelectric film 200 is distributed outside the surface, the bottom electrode 400 needs to be formed in the high frequency surface acoustic wave resonator, and at this time, an electric field is applied to the piezoelectric film 200 by the combined action of the top electrode 300 and the bottom electrode 400, so that the piezoelectric film 200 excites the target elastic wave.

The performance of the high frequency surface acoustic wave resonator in the present embodiment is described below by finite element simulation. Take a surface acoustic wave resonator as an example, which uses silicon carbide as a supporting substrate and a lithium niobate single crystal film (500 nm) as a piezoelectric film (i.e. $LiNbO_3/SiC$ structure, also called HF-SAW structure). Take another surface acoustic wave resonator as a control example, which uses silicon as a supporting substrate and a lithium niobate single crystal thin film (500 nm) as a piezoelectric film, a silicon dioxide layer (500 nm) is formed between the supporting substrate and the piezoelectric film (i.e. $LiNbO_3/SiO_2/Si$ structure, also called IHP-SAW structure).

Figure 3:
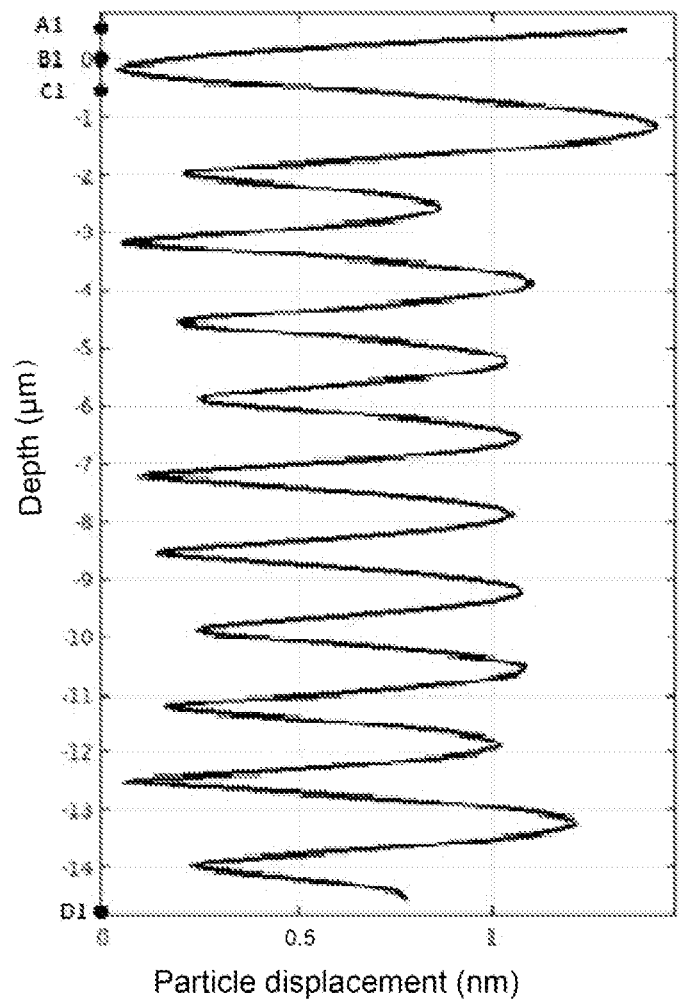
FIG. 3 shows the displacement of particles of a surface acoustic wave resonator of an IHP-SAW structure in the depth direction at a frequency point of f1.

An S0 wave having a wavelength of 2 μm is excited in the piezoelectric film by adjusting an electric field distribution applied on the piezoelectric film. The wave velocity of the S0 wave in $LiNbO_3$ is about 6400 m/s, which is larger than the velocity of the body wave in $SiO_2$ and Si, and smaller than the slowest velocity of the body wave in SiC (about 7160 m/s). The simulation results of the energy distribution comparison and the admittance-frequency response comparison of the above two structures are as follows:

For the IHP-SAW structure, as shown in FIG. 3, the vibration energy of the S0 wave excited in the piezoelectric film leaks severely to the supporting substrate, so that the surface acoustic wave resonator of the IHP-SAW structure cannot form an effective resonance. FIG. 3 shows the displacement of the mass points of the IHP-SAW structure in the depth direction from the A1 point to the D1 point in the frequency point of f1 in FIG. 5. It is observed that the particle displacement in the LiNbO3 film (A1-B1 region) is not much different from the particle displacement in the $SiO_2$ film (B1-C1 region) and the particle displacement in the Si substrate (C1-D1 region). That is, a large amount of vibration energy of the S0 wave excited in the LiNbO3 film was leaked to the composite substrate composed of SiO2/Si.

Figure 4:
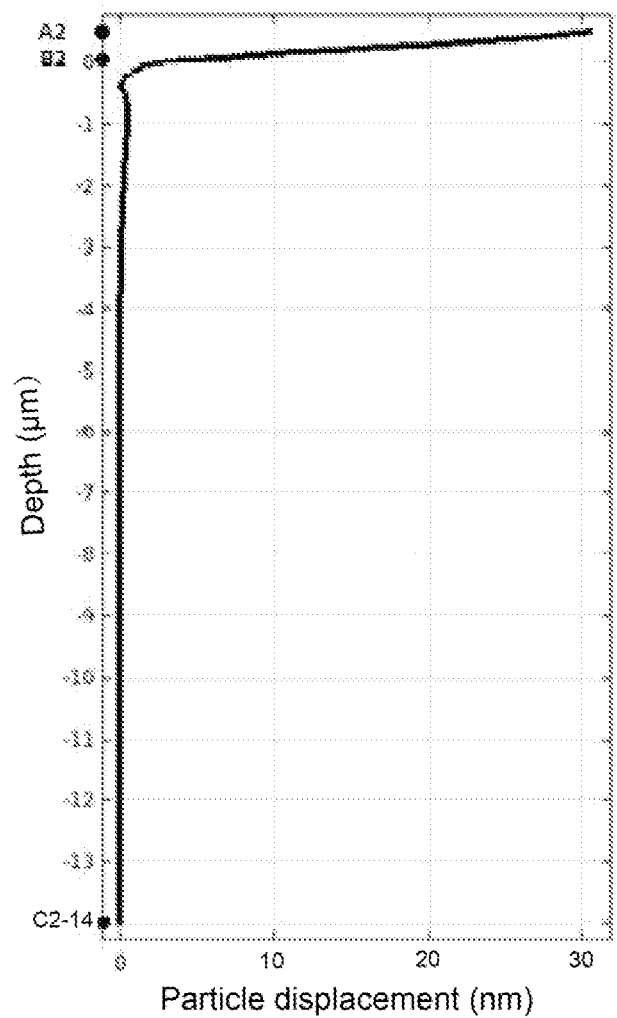
FIG. 4 shows the displacement of particles of a surface acoustic wave resonator of an HF-SAW structure in the depth direction at a frequency point of f2.

For the HF-SAW structure, as shown in FIG. 4, since the slowest velocity of the body wave in SiC is greater than the velocity of the S0 wave in $LiNbO_3$, the vibration energy of the S0 wave is effectively confined in the $LiNbO_3$ film and the $LiNbO_3$/SiC interface, which is difficult to leak to the supporting substrate, so that the surface acoustic wave resonator of the LL-SAW structure can form an effective resonance. FIG. 4 shows the displacement of the mass points of the HF-SAW structure in the depth direction from the A2 point to the C2 point in the frequency point of f2 in FIG. 5. It is observed that the particle displacement in the LiNbO3 film (A2-B2 region) is much larger than that in the SiC substrate (B2-C2) region (the particle displacement in the SiC substrate is about 0). That is, the vibration energy of the S0 wave excited in the LiNbO₃ film is almost completely constrained in the LiNbO₃ film and the LiNbO₃/SiC interface, thereby forming a good resonance and having a high Q value.

Figure 5:
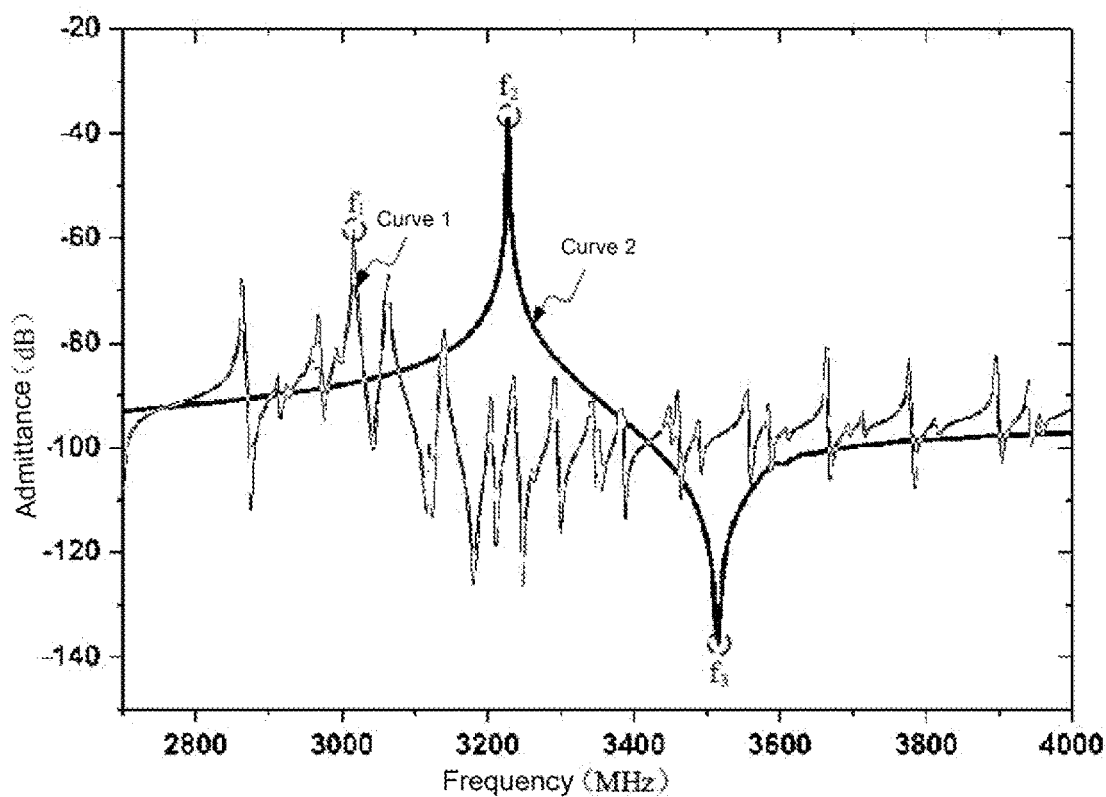
FIG. 5 shows admittance-frequency response curves when an S0 wave is excited by the surface acoustic wave resonator of the IHP-SAW structure and the surface acoustic wave resonator of the HF-SAW structure.

FIG. 5 shows the admittance-frequency response curves when the above two structures excite the S0 wave. As can be seen from FIG. 5, the S0 wave excited in the HF-SAW structure can form an effective resonance, the resonance point is f2, and the anti-resonance point is f3 (specifically shown in curve 2 in FIG. 5). The S0 wave excited in the IHP-SAW structure leaks heavily to the substrate, and cannot form an effective resonance, which in turn forms various types of stray waves (specifically shown in curve 1 in FIG. 5).

Figure 6:
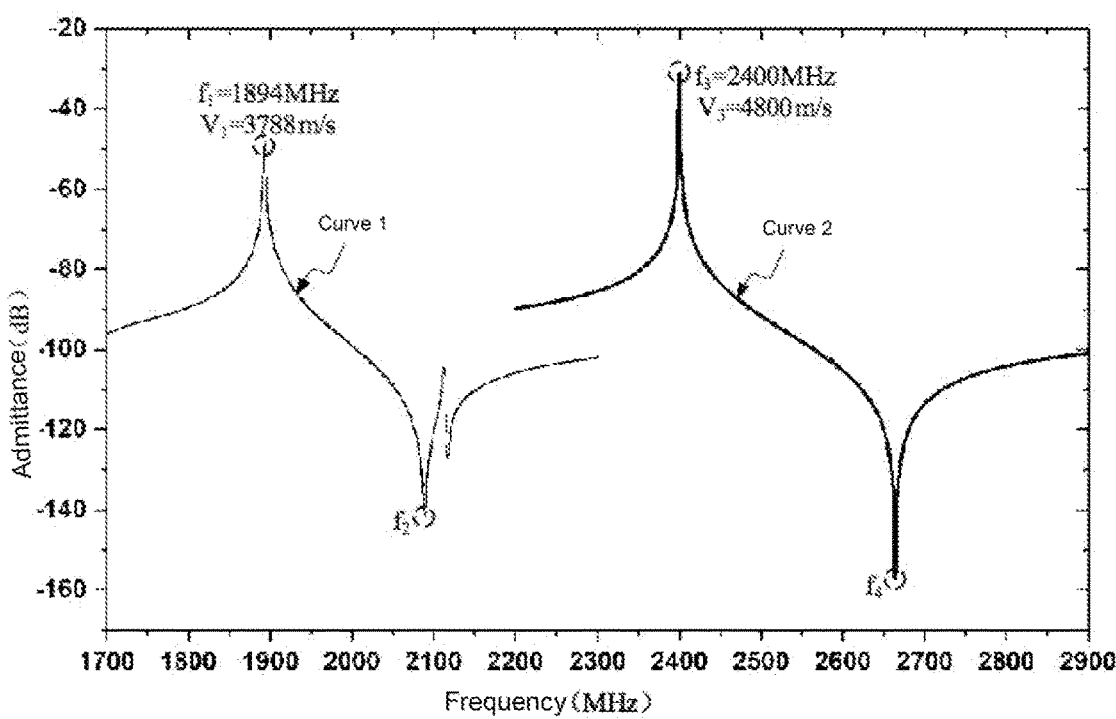
FIG. 6 shows admittance-frequency response curves when an SH0 wave is excited by the surface acoustic wave resonator of the IHP-SAW structure and the surface acoustic wave resonator of the HF-SAW structure.

An SH0 wave having a wavelength of 2 µm is excited in the piezoelectric film by adjusting an electric field distribution applied on the piezoelectric film. FIG. 6 shows the admittance-frequency response curves when the above two structures excite the SH0 wave. It can be seen from FIG. 6 that the velocity of the SH0 wave excited by the IHP-SAW structure is about 3788 m/s, and the corresponding resonance frequency f1 is 1894 MHz (specifically shown in curve 1 in FIG. 6). The velocity of the SH0 wave excited by the HF-SAW structure is increased to 4800 m/s, and the corresponding resonant frequency f3 is increased to 2400 MHz (specifically shown in curve 2 in FIG. 6). That is, the HF-SAW structure can increase the velocity of the SH0 wave. At the same time, it can be seen from FIG. 6 that the resonance peak corresponding to the resonance frequency point f3 is sharper than the resonance peak corresponding to the resonance frequency point f1, which indicates that the Q value at the resonance frequency point f3 is higher, that is, the HF-SAW increases the velocity of the SH0 wave while maintaining a higher Q value.

It can be seen that the piezoelectric film is used to excite the S0 wave having a high wave velocity, at the same time, the supporting substrate having a higher wave velocity is used to constrain the S0 wave having a high wave velocity to propagate to the supporting substrate, thereby improving the resonance frequency of the surface acoustic wave resonator by using the S0 wave having a high wave velocity. Even if the piezoelectric film excites the SH0 wave with wave velocity lower than the S wave and the A wave, the high frequency surface acoustic wave resonator can still form a composite film by using a supporting substrate having a higher wave velocity and a piezoelectric film. The high wave velocity of the SH0 wave at the interface of the supporting substrate increases the overall wave velocity of the SH0 wave, thereby increasing the resonance frequency of the surface acoustic wave resonator by increasing the wave velocity of the SH0 wave.

In summary, the high frequency surface acoustic wave resonator and the method for making the same of the present disclosure have the following beneficial effects: in the present disclosure, the velocity of the body wave propagating in the high wave velocity supporting substrate is greater than the velocity of the target elastic wave propagating in the piezoelectric film. Therefore, when the piezoelectric film excites the symmetrical lamb wave or the antisymmetric lamb wave with a high wave velocity, a supporting substrate having a higher wave velocity is used to constrain the symmetric lamb wave or the antisymmetric lamb wave to propagate to the supporting substrate, thereby improving the resonant frequency of the surface acoustic wave resonator by increasing the velocity of the target elastic wave while maintaining a high Q value. Or when the piezoelectric film excites a shearing constant wave or a Rayleigh wave, an interfacial composite film is formed by using a supporting substrate having a higher wave velocity and a piezoelectric film, the overall propagating wave velocity of the shearing constant wave or the Rayleigh wave in the piezoelectric film is increased through the high wave velocity of the shearing constant wave or the Rayleigh wave at the interface of the supporting substrate, thereby improving the resonant frequency of the surface acoustic wave resonator by increasing the velocity of the target elastic wave while maintaining a high Q value. In the present disclosure, the ratio of the thickness of the piezoelectric film to the wavelength of the target elastic wave excited by the piezoelectric film is less than 2, so as to perform dispersion compensation on the target elastic wave, thereby exciting the target elastic wave with a higher wave velocity. In the present disclosure, the angle between the perpendicular direction of each of the digits in the interdigital electrode and the propagation direction of the target elastic wave is less than 20°, so as to suppress the clutter in the parallel interdigital direction in the target elastic wave, thereby further improving the electromechanical coupling coefficient and Q value of the high frequency surface acoustic wave resonator. In the present disclosure, the thermal conductivity of the high wave velocity supporting substrate is greater than the thermal conductivity of the piezoelectric film, so as to reduce the temperature drift of the high frequency surface acoustic wave resonator, thereby improving the temperature drift stability and the power bearing capacity of the high frequency surface acoustic wave resonator. Therefore, the present disclosure effectively overcomes various shortcomings and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A high frequency surface acoustic wave resonator, comprising:
   a high wave velocity supporting substrate;
   a piezoelectric film, disposed on a top surface of the high wave velocity supporting substrate; and
   a top electrode, disposed on a top surface of the piezoelectric film;
   wherein a target elastic wave excited by the piezoelectric film comprises a symmetric lamb wave or an antisymmetric lamb wave, wherein a thickness of the top electrode, and materials of the high wave velocity supporting substrate and the piezoelectric film are so configured that a velocity of a body wave propagating in the high wave velocity supporting substrate is greater than a velocity of a target elastic wave propagating in the piezoelectric film, and a thermal conductivity of the high wave velocity supporting substrate is greater than a thermal conductivity of the piezoelectric film;
   a material of the high wave velocity supporting substrate comprises: silicon carbide; a material of the piezoelectric film comprises: lithium niobate; the piezoelectric film is a single crystal film;

when the top electrode is an interdigital electrode, digits in the interdigital electrode are parallel to each other, and an angle between a perpendicular direction of each of the digits and a propagation direction of the target elastic wave is less than 20°;

a ratio of a thickness of the piezoelectric film to a wavelength of the target elastic wave excited by the piezoelectric film is from 0.05 to 0.35.

2. The high frequency surface acoustic wave resonator according to claim 1, wherein the top electrode comprises one or a combination of a circular strip electrode, and a sector strip electrode.

3. The high frequency surface acoustic wave resonator according to claim 1, further comprising: a bottom electrode disposed between the high wave velocity supporting substrate and the piezoelectric film.

4. A method for making a high frequency surface acoustic wave resonator, comprising:
providing a high wave velocity supporting substrate, wherein a material of the high wave velocity supporting substrate comprises: silicon carbide;
forming a piezoelectric film on a top surface of the high wave velocity supporting substrate, wherein a material of the piezoelectric film comprises: lithium niobate; the piezoelectric film is a single crystal film; and
forming a top electrode on a top surface of the piezoelectric film;

wherein a target elastic wave excited by the piezoelectric film comprises a symmetric lamb wave or an antisymmetric lamb wave, wherein a thickness of the top electrode, and materials of the high wave velocity supporting substrate and the piezoelectric film are so configured that a velocity of a body wave propagating in the high wave velocity supporting substrate is greater than a velocity of a target elastic wave propagating in the piezoelectric film, and a thermal conductivity of the high wave velocity supporting substrate is greater than a thermal conductivity of the piezoelectric film; when the top electrode is an interdigital electrode, digits in the interdigital electrode are parallel to each other, and an angle between a perpendicular direction of each of the digits and a propagation direction of the target elastic wave is less than 20°;

wherein a ratio of a thickness of the piezoelectric film to a wavelength of the target elastic wave excited by the piezoelectric film is from 0.05 to 0.35.

5. The method for making a high frequency surface acoustic wave resonator according to claim 4, wherein the top electrode comprises one or a combination of a circular strip electrode, and a sector strip electrode.

6. The method for making a high frequency surface acoustic wave resonator according to claim 4, further comprising: forming a bottom electrode between the high wave velocity supporting substrate and the piezoelectric film.

* * * * *